United States Patent
Andersen et al.

(10) Patent No.: US 11,854,818 B2
(45) Date of Patent: Dec. 26, 2023

(54) ANGLED ETCH FOR SURFACE SMOOTHING

(71) Applicant: Applied Materials, Inc., Santa Clara, CA (US)

(72) Inventors: Tassie Andersen, Salem, MA (US); Shurong Liang, Lynnfield, MA (US)

(73) Assignee: Applied Materials, Inc., Santa Clara, CA (US)

( * ) Notice: Subject to any disclaimer, the term of this patent is extended or adjusted under 35 U.S.C. 154(b) by 16 days.

(21) Appl. No.: 17/307,813

(22) Filed: May 4, 2021

(65) Prior Publication Data
US 2022/0359217 A1    Nov. 10, 2022

(51) Int. Cl.
*H01L 21/308* (2006.01)
*H01L 21/3065* (2006.01)

(52) U.S. Cl.
CPC ...... *H01L 21/3085* (2013.01); *H01L 21/3065* (2013.01)

(58) Field of Classification Search
None
See application file for complete search history.

(56) References Cited

U.S. PATENT DOCUMENTS

| | | | |
|---|---|---|---|
| 7,846,645 B2 * | 12/2010 | Urakawa | H01L 21/0273 430/311 |
| 8,133,804 B1 * | 3/2012 | Godet | H01J 37/3056 438/528 |
| 8,329,585 B2 | 12/2012 | Sheu et al. | |
| 8,460,569 B2 | 6/2013 | Godet et al. | |
| 9,663,862 B2 | 5/2017 | Sato et al. | |
| 2010/0096566 A1 * | 4/2010 | Bristol | H01J 37/3056 250/492.2 |
| 2012/0082942 A1 | 4/2012 | Godet et al. | |
| 2014/0306127 A1 * | 10/2014 | Godet | H01J 37/317 250/492.21 |

* cited by examiner

*Primary Examiner* — Stephanie P Duclair
(74) *Attorney, Agent, or Firm* — NIELDS, LEMACK & FRAME, LLC (57) ABSTRACT

Methods of processing a feature on a semiconductor workpiece are disclosed. The method is performed after features have been created on the workpiece. An etching species may be directed toward the workpiece at a non-zero tilt angle. In certain embodiments, the tilt angle may be 30° or more. Further, the etching species may also be directed with a non-zero twist angle. In certain embodiments, the etching species may sputter material from the features, while in other embodiments, the etching species may be a chemically reactive species. By adjusting the tilt and twist angles, as well as the flow rate of the etching species and the exposure time, the LER and LWR of a feature may be reduced with minimal impact of the CD of the feature.

15 Claims, 8 Drawing Sheets

ANGLED ETCH FOR SURFACE SMOOTHING

FIELD

This disclosure describes methods for fabricating semiconductor devices, and more particularly, reducing line edge roughness (LER) and line width roughness (LWR).

BACKGROUND

As semiconductor fabrication processes continue to evolve, line widths are becoming increasingly smaller. One effect of this is an increase in line width roughness (LWR) and line edge roughness (LER). Line width roughness is a measure of the variation of the width of a feature on the semiconductor workpiece. Line edge roughness may be defined as the three sigma deviation of a line edge from a straight line.

To ensure uniform performance, these metrics are sought to be as low as possible. Traditional lithography techniques may be used to achieve features having the desired critical dimension (CD). However, these features may have an unacceptable LWR and/or LER measurements. For example, artifacts of pattern transfer, such as line roughness, line wiggling and variations in line width, may occur. This variation leads to performance variation, and possibly yield degradation.

Achieving a feature with the desired CD and acceptable LER and LWR values is an ongoing challenge. One approach that has been used is to perform an implant process that modifies the outer layer of the feature, such that the modified outer layer may be preferentially etched.

While effective, this is a multistep process that increases processing time, and therefore lower throughput.

Therefore, it would be beneficial if there were a method of post processing these features that only utilizes a single process. Further, it would be advantageous if this method did not change the CD of the feature significantly.

SUMMARY

Methods of processing a feature on a semiconductor workpiece are disclosed. The method is performed after the features have been created on the workpiece. An etching species may be directed toward the workpiece at a non-zero tilt angle. In certain embodiments, the tilt angle may be 30° or more. Further, the etching species may also be directed with a non-zero twist angle. In certain embodiments, the etching species may sputter material from the features, while in other embodiments, the etching species may be a chemically reactive species. By adjusting the tilt and twist angles, as well as the flow rate of the etching species and the exposure time, the LER and LWR of a feature may be reduced with minimal impact of the CD of the feature.

According to one embodiment, a method of processing a feature on a workpiece is disclosed. The method comprises patterning a resist layer disposed on the workpiece; etching the workpiece while the resist layer is in place to define the feature on the workpiece, wherein the feature comprises a critical dimension, a line width roughness, and line edge roughness; and performing an etch process using a high tilt angle, wherein after the etch process, the line width roughness and the line edge roughness of the feature are each reduced by at least 15%. In certain embodiments, the high tilt angle is between 30° and 80°. In some embodiments, the high tilt angle is between 50° and 65°. In certain embodiments, the critical dimension of the feature is changed by less than 2 nanometers. In some embodiments, the etch process utilizes a sputtering species. In certain embodiments, the etch process utilizes a chemically reactive species. In some embodiments, the line width roughness and the line edge roughness are each reduced by at least 20%. In certain embodiments, a non-zero twist angle is used during the etch process.

According to another embodiment, a method of processing a feature on a workpiece, wherein the feature comprises at least two layers of different materials, is disclosed. The method comprises patterning a resist layer disposed on the workpiece; etching the workpiece while the resist layer is in place to define the feature on the workpiece, wherein the feature comprises a critical dimension, a line width roughness, and line edge roughness; performing a first etch process using a first species and a first high tilt angle; and performing a second etch process using a second species and a second high tilt angle, and wherein after the first etch process and second etch process, the line width roughness and the line edge roughness of the feature are each reduced by at least 15%. In some embodiments, one of the first species and the second species is selected to selectively etch one of the at least two layers of the feature. In certain embodiments, the first high tilt angle is different from the second high tilt angle. In some embodiments, at least one of the first species or the second species comprises a sputtering species. In certain embodiments, at least one of the first species or the second species comprises a chemically reactive species. In some embodiments, the first high tilt angle is between 30° and 80°. In certain embodiments, the first high tilt angle is between 50° and 65°. In some embodiments, the second high tilt angle is between 30° and 80°. In certain embodiments, the second high tilt angle is between 50° and 65°. In some embodiments, the critical dimension of the feature is changed by less than 2 nanometers. In certain embodiments, the line width roughness and the line edge roughness are each reduced by at least 20%. In some embodiments, a non-zero twist angle is used during at least one of the first etch process and the second etch process.

BRIEF DESCRIPTION OF THE FIGURES

For a better understanding of the present disclosure, reference is made to the accompanying drawings, which are incorporated herein by reference and in which.

DETAILED DESCRIPTION

The present disclosure describes the use of directional etching using non-zero tilt and optionally non-zero twist angles to achieve features with reduced LWR and LER values. In this disclosure, the term "feature" refers to any three dimensional structure that extends vertically from the workpiece.

The directional etching may be achieved using a variety of semiconductor processing apparatus.

Figure 1:
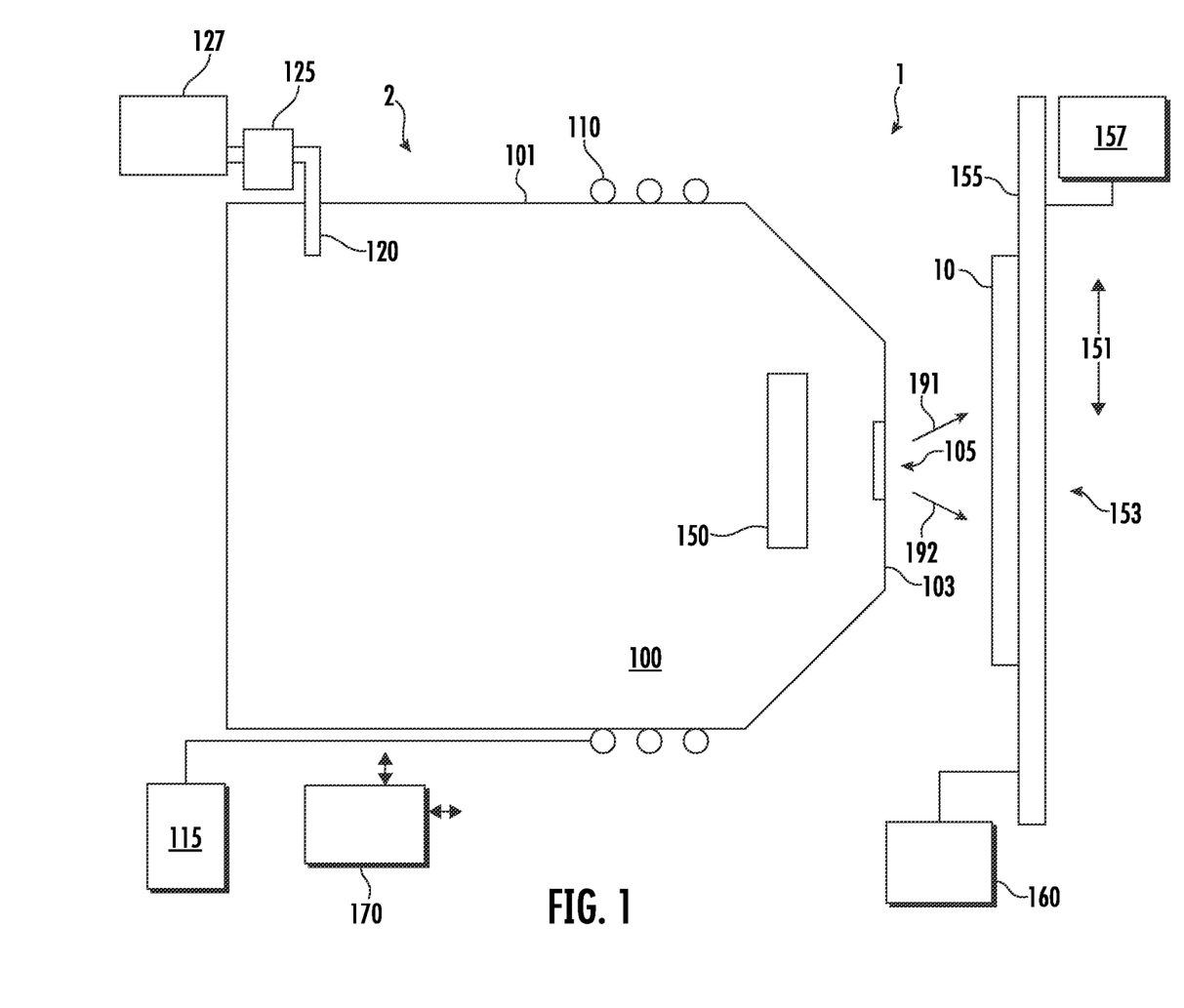
FIG. 1 shows a semiconductor processing apparatus that may be utilized according to one embodiment.

FIG. 1 shows one such semiconductor processing apparatus that may be used to create the directional etching. The semiconductor processing apparatus 1 includes an ion source 2. The ion source 2 includes an ion source chamber 100, comprised of a plurality of chamber walls 101. In certain embodiments, one or more of these chamber walls 101 may be constructed of a dielectric material, such as quartz. An RF antenna 110 may be disposed on an exterior surface of one or more of these chamber walls. In certain embodiments, the RF antenna 110 may wrap around the exterior of the ion source chamber 100. The RF antenna 110 may be powered by a RF power supply 115. The energy delivered to the RF antenna 110 is radiated within the ion source chamber 100 to ionize a feed gas, which is introduced via gas inlet 120. The gas inlet 120 may be in communication with an ion source mass flow controller 125, or similar mechanism to control the flow of gas from the gas container 127 to the ion source chamber 100.

Further, while only one gas container 127 and ion source mass flow controller 125 are shown, it is understood that there may be a plurality of gas containers that contain various gasses that may be introduced into the ion source chamber 100. Each gas container 127 may have a respective mass flow controller. In this way, the controller 170 may select both the species that is introduced into the ion source chamber 100, as well as its flow rate.

One chamber wall, referred to as the extraction plate 103 includes an extraction aperture 105 through which ions may exit the ion source chamber 100. The extraction plate 103 may be constructed of an electrically conductive material, such as titanium, tantalum or another metal; of an electrically insulating material such as alumina, $Al_2O_3$ or another insulator; or a combination of conductive and insulating materials. The extraction plate 103 may be in excess of 300 millimeters in width. Further, the extraction aperture 105 may be wider than the diameter of the workpiece 10. The longer dimension, or width, may be referred to as the X direction, while the short dimension, or height, may be referred to as the Y direction with the workpiece 10 scanning motion being parallel to the Y direction. This extraction plate 103 may be biased at an extraction voltage. In other embodiments, the extraction plate 103 may be grounded.

Disposed within the ion source chamber 100 may be a blocker 150. The blocker 150 may be a dielectric material that is used to affect the plasma sheath in the vicinity of the extraction aperture 105. For example, in certain embodiments, the blocker 150 is disposed such that the ions exit the extraction aperture 105 at an extraction angle that is not perpendicular to the workpiece 10. In certain embodiments, ions may be extracted at two different extraction angles. In this embodiment, a first beamlet 191 and a second beamlet 192 are directed toward the workpiece 10. In other embodiments, the ions are extracted at a single extraction angle. The placement of the blocker 150 within the ion source chamber 100 relative to the extraction aperture 105 defines the angle or angles at which the ions impact the workpiece 10.

A movable workpiece holder 153 is disposed proximate the extraction aperture 105. The movable workpiece holder 153 includes a platen 155 on which the workpiece 10 is disposed. The platen 155 is scanned using a scan motor 157, which moves the platen 155 in the direction 151. As stated above, the direction 151 is parallel to the Y direction. In certain embodiments, the movable workpiece holder 153 may be rotated about the center of the workpiece 10, so as to create a non-zero twist angle.

In certain embodiments, the platen 155 may be biased using a workpiece bias power supply 160. In certain embodiments, the output from the workpiece bias power supply 160 is a pulsed DC voltage, having a frequency of between 5 kHz and 50 kHz and an amplitude of zero to 5,000 volts.

While the above disclosure describes the output from the workpiece bias power supply 160 as being a pulsed DC voltage, it is understood that the workpiece bias power supply 160 may be constant, while the extraction voltage power supply provides a pulsed DC output.

When pulsed, the voltage applied to the platen 155 is more negative than the voltage applied to the extraction plate 103. In other words, if the extraction plate 103 is grounded, the workpiece bias power supply 160 generates negative pulses. During these negative pulses, positive ions are attracted from the interior of the ion source chamber 100 to the workpiece 10. If the extraction plate 103 is positively biased, the workpiece bias power supply 160 generates less positive or negative pulses, such that positive ions are attracted from the interior of the ion source chamber 100 to the workpiece 10 during these pulses.

Additionally, the semiconductor processing apparatus 1 includes a controller 170. The controller 170 may include a processing unit, such as a microcontroller, a personal computer, a special purpose controller, or another suitable processing unit. The controller 170 may also include a non-transitory computer readable storage element, such as a semiconductor memory, a magnetic memory, or another suitable memory. This non-transitory storage element may contain instructions and other data that allows the controller 170 to perform the functions described herein. The controller 170 may be capable of controlling the species and the flow rate of gasses into the ion source chamber 100 by providing controls to one or more of the ion source mass flow controllers 125. Additionally, the controller 170 may be capable of controlling the energy supplied to the ion source chamber 100 via control of RF power supply 115. Lastly, the controller 170 may control the motion and bias of the workpiece 10 through control of scan motor 157 and workpiece bias power supply 160.

The semiconductor processing apparatus 1 may be used to perform directional etching processes. Specifically, as described above, in certain embodiments, the blocker 150 may be used to alter the angle at which ions exit through the extraction aperture 105. Specifically, the blocker 150 affects the angle relative to the Y direction, but does not affect the angle relative to the X direction. In other embodiments, the placement of the blocker 150 may be fixed, such that the first beamlet 191 and the second beamlet 192 impact the workpiece 10 at an angle of approximately 30°.

Figure 2:
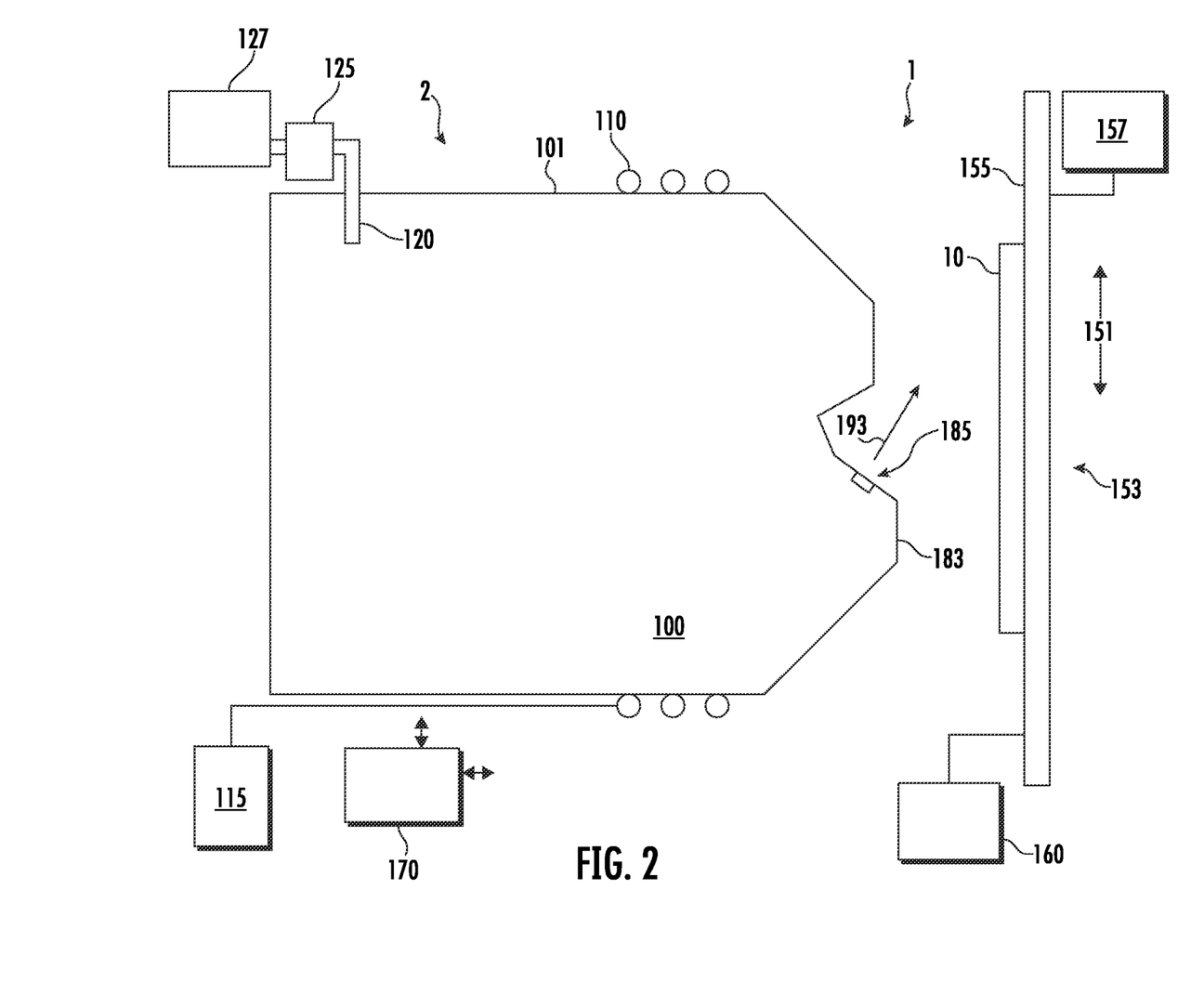
FIG. 2 shows a semiconductor processing apparatus that may be utilized according to a second embodiment.

FIG. 2 shows a second semiconductor processing apparatus that may be utilized. Much of this apparatus is similar to that shown in FIG. 1 and like components have been given identical reference designators.

In this apparatus, the blocker is not utilized. Rather, the extraction plate 183 is shaped such that the extraction aperture 185 is disposed on a surface that is not parallel to the workpiece 10. In this way, the tilt angle of the beamlets 193 may be 50° or more.

Figure 3A:
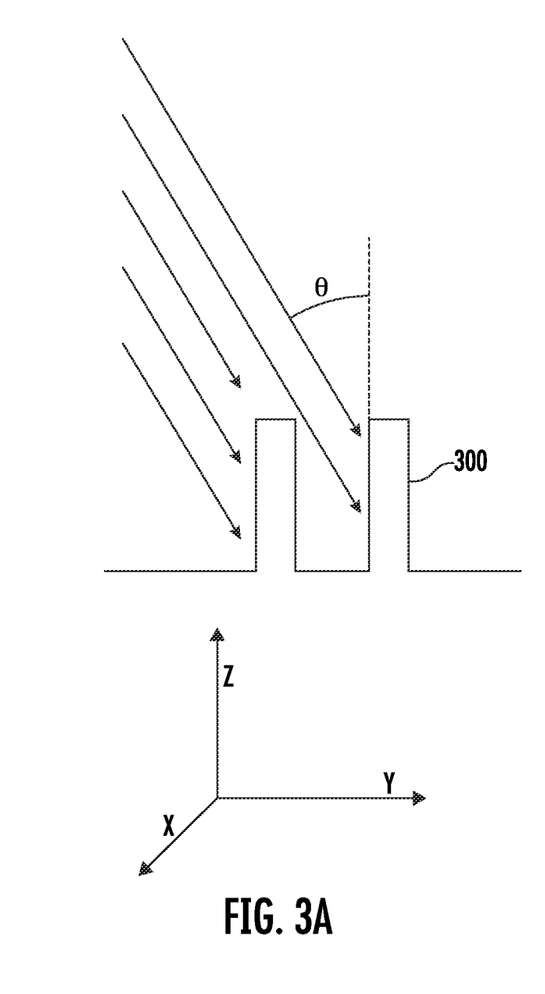
FIG. 3A-3B show the effect of tilt and twist angle, respectively.
Figure 3B:
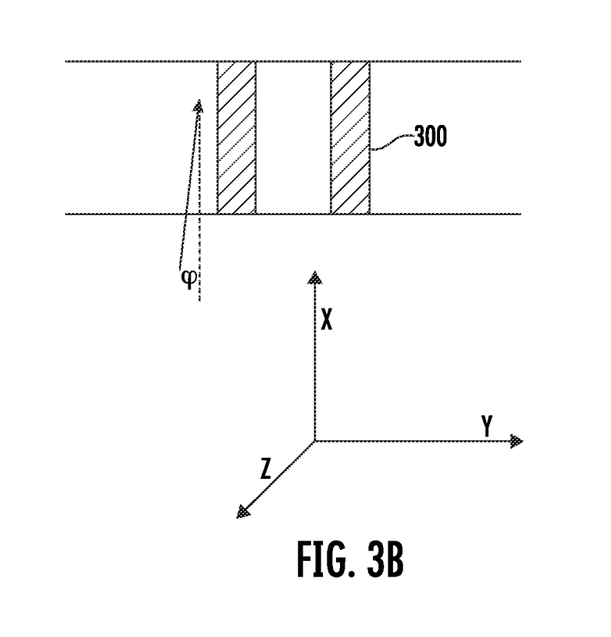

FIG. 3A shows the tilt angles ($\theta$) that are achieved by the semiconductor processing apparatus of FIGS. 1-2. Tilt angle causes the etching species to be directed at an angle ($\theta$) that is not perpendicular to the workpiece. Thus, the ions are able to strike the sides of the feature 300. FIG. 3B shows the effect of twist angle (φ). Twist angle causes the etching species to be directed at an angle (φ) that is not parallel to the features 300 on the workpiece.

There are a variety of different types of features. Several of those are described herein. These features are typically created by patterning a resist layer on the workpiece, etching the workpiece while the resist layer is in place, so as to remove material from areas that are not covered by the resist layer. In some embodiments, the resist layer is then removed. In other embodiments, the resist layer may remain intact as subsequent processes are performed. The regions that were covered by the resist layer during this etching process form the features.

Figure 4A:
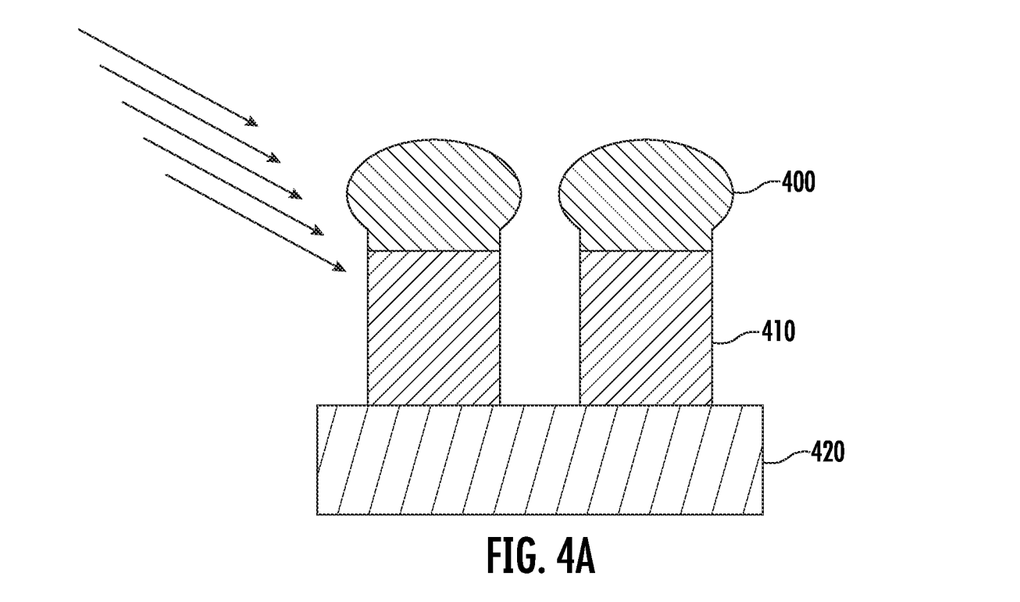
FIGS. 4A-4B shows a feature disposed on a semiconductor workpiece, prior to and after the directional etching process, respectively.
Figure 4B:
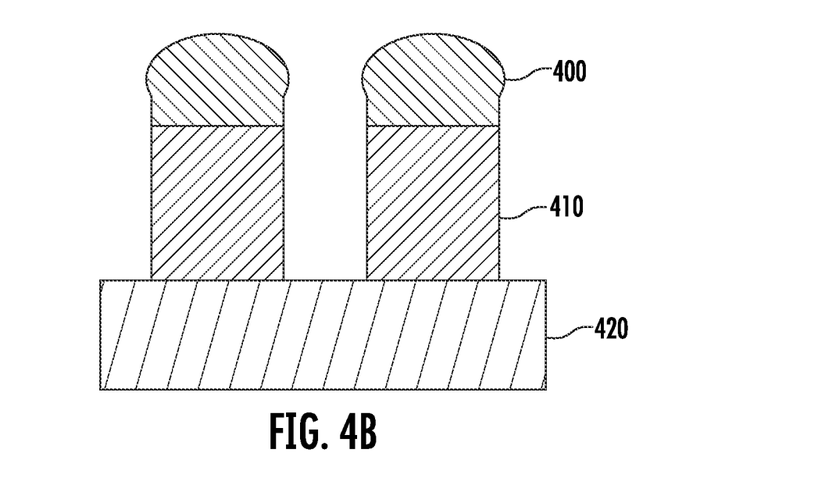

FIG. 4A shows a first feature, which includes a cap 400 disposed on a layer 410. In certain embodiments, the cap 400 may comprise a silicon anti-reflecting coating, such as silicon oxynitride. The layer 410 may comprise an organic planarization layer, such as an amorphous carbon layer. The feature may be disposed on a base 420 which may be silicon oxide or another material. In this example, the layer 410 may have a height of between 30 nm and 100 nm, while the cap 400 may have a height of between 10 nm and 30 nm. The CD of the feature may be between 20 and 40 nm. The LWR of this feature, as fabricated, was 3.8 nanometers and the LER was 2.7 nanometers. In certain embodiments, the cap 400 may overhang the rest of the feature. In this scenario, an etching process that utilizes an angle that is close to normal cannot reduce the overhang, without also reducing the overall height of the cap 400 or etching into the base 420. In contrast, a high tilt angle allows most of the ions to strike the side of the cap 400, reducing the overhang, as shown in FIG. 4B. Furthermore, due to the high tilt angle, few of the ions reach the layer 410 disposed below the cap 400, reducing the amount of etching that occurs to the layer 410. In some embodiments, by using a high tilt angle, the LER and LWR were reduced by more than 15% while the CD of the feature was changed by less than 2 nm. In this disclosure, the term "high tilt angle" is defined as a tilt angle that is greater than or equal to 30°. In certain embodiments, the tilt angle may be greater than or equal to 50°. In some embodiments, the tilt angle may be between 50° and 80°.

Figure 5A:
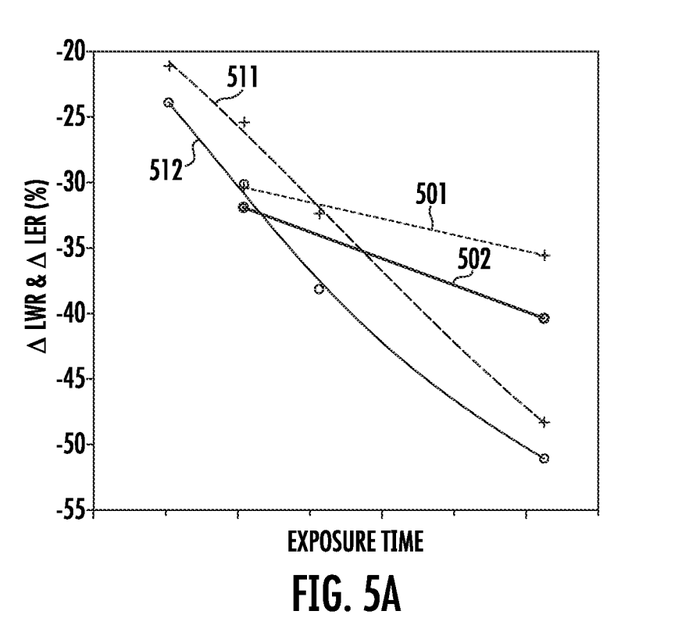
FIGS. 5A-5B show the effects of tilt and twist on LER and LWR.
Figure 5B:
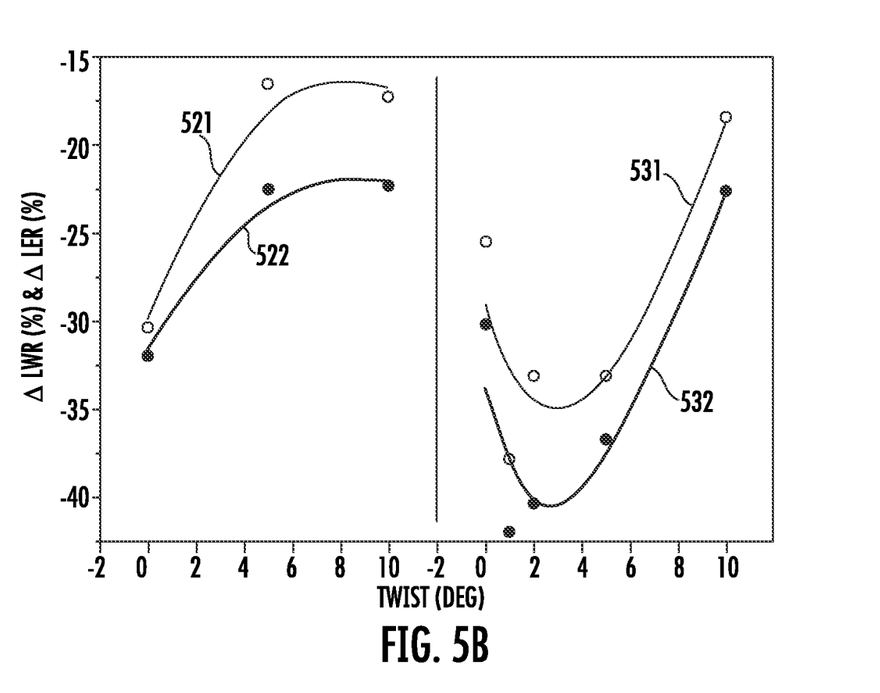

FIGS. 5A-5B shows the effect of high tilt angle in reducing LER and LWR. In this test, the etching species was argon, the RF power was 300 W, and the extraction voltage was 1.75 kV. The extraction aperture was 6 mm from the workpiece. Of course, other values may be used.

The vertical axis of FIG. 5A shows the decrease in LER and LWR, represented as percentages. The horizontal axis represents exposure time. Lines 501, 502 show the percentage change in LER and LWR, respectively, for a directional etching process, where the tilt angle was about 30°. Lines 511, 512 show the percentage change in LER and LWR, respectively, for a directional etching process, where the tilt angle was about 60°. In this figure, more negative values are preferred.

Note that LER and LWR are decreased for both tilt angles, although the decrease in LER and LWR is more pronounced with the higher tilt angle etching process, especially at longer exposure times. Specifically, the LER may be reduced by 45% or more, when a tilt angle of 60° or more is used, depending on exposure time. LER is reduced by more than 30% when a tilt angle of 30° is used. Similarly, LWR may be reduced by 45% or more, when a tilt angle of 60° or more is used, depending on exposure time. LWR is reduced by more than 30% when a tilt angle of 30° is used.

Thus, in certain embodiments, both LER and LWR were reduced by more than 15%. In some embodiments, a high tilt process may reduce LWR by at least 20%. In some embodiments, LWR may be reduced by at least 25%. In some embodiments, LWR may be reduced by at least 30%. In some embodiments, LWR may be reduced by at least 35%. A high tilt angle process may reduce LER by at least 20%. In some embodiments, LER may be reduced by at least 25%. In some embodiments, LER may be reduced by at least 30%. These reductions may be achieved while affecting the CD by less than 2 nm. Furthermore, in certain embodiments, the CD may be increased or decreased by 1 nm or less.

FIG. 5B shows the effects of twist angle. The horizontal axis represents twist angle while the vertical axis of FIG. 5B shows the corresponding decrease in LER and LWR, represented as percentages. Lines 521, 522 show the percentage change in LER and LWR, respectively, for a directional etching process, where the tilt angle was about 30°. Lines 531, 532 show the percentage change in LER and LWR, respectively, for a directional etching process, where the tilt angle was about 60°. In this figure, more negative values are preferred.

Note that for smaller tilt angles, increasing twist angle may be detrimental. However, for larger tilt angles, there is a range of twist angles where LER and LWR are decreased significantly.

Thus, in certain embodiments, the twist angle may further improve the performance of the high tilt process. For example, in certain embodiments, a twist angle of up to 10° may be employed. The LER may be reduced by more than 15% in certain embodiments. In other embodiments, the LER may be reduced by more than 20%. In other embodiments, the LER may be reduced by more than 25% or 30%. Further, the LWR may be reduced by more than 20% in certain embodiments. In other embodiments, the LWR may be reduced by more than 25% or 30%. These results may be achieved by affecting the CD by less than 2 nm.

Thus, with respect to the feature shown in FIG. 4A, it can be seen that a directional etching process can achieve a reduction in LER and LWR with minimal change to CD. Without being bound to any theory, it is believed that the directional etching with argon serves to remove material from peaks, or high points, in the feature and redeposit that material in the valleys. Thus, redistribution of material serves to reduce LER and LWR without significantly affecting CD.

Further, while FIGS. 5A-5B are directed toward a directional etching using argon, other etching species may be employed. For example, a mixture of argon and nitrogen, wherein the nitrogen may represent up to 25% of the total volume may be used. For example, in one test, a mixture comprising 11% nitrogen and 89% argon was used for a high tilt angle (i.e. greater than 50°) directional etch. The result was a reduction of only 0.5 nm in CD, with reductions in LER and LWR of 18.7% and 20.8%, respectively. Another test showed a reduction of 1.6 nm in CD, with reductions in LER and LWR of 18.8% and 27.1%, respectively.

In summary, by modifying extraction voltage, tilt angle, twist angle, the source power, the composition and flow rate of the etching species and exposure time, a directional etching process may be performed that reduces the CD by less than 2 nm, while reducing LER and LWR by at least 15%. In certain embodiments, the CD may be changed by less than 2 nm while the LER and LWR values were reduced by more than 20%. In certain embodiments, the CD may be changed by less than 2 nm while the LER and LWR values were reduced by more than 30%. In other embodiments, at least one of the LER and LWR values may be reduced by more than 40%, while the CD is changed by less than 2 nm. These results may be achieved using a tilt angle of between 30° and 80°. In some embodiments, the tilt angle is between 30° and 65°. In certain embodiments, the tilt angle is between 50° and 65°.

This result was also obtained with other features and etching species.

Figure 6:
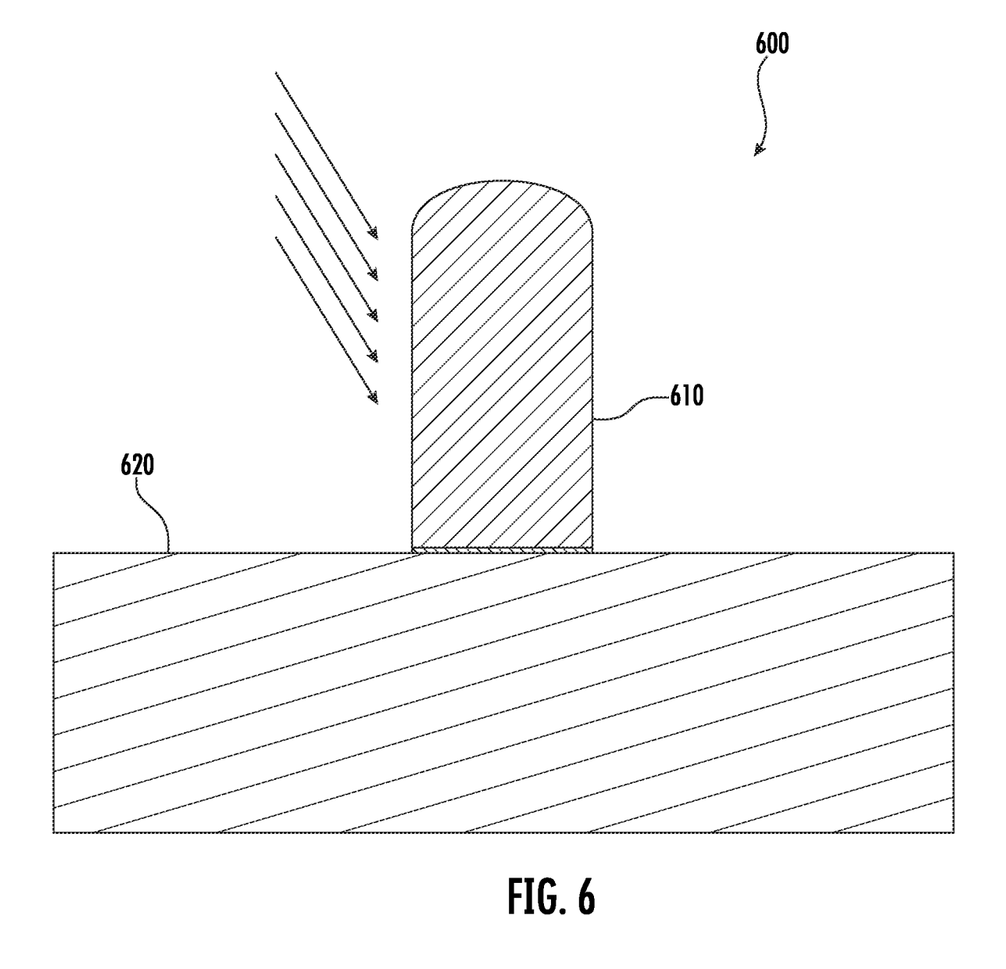
FIG. 6 shows a feature disposed on a semiconductor workpiece, according to a second embodiment.

FIG. 6 shows a feature 600 according to another embodiment, which comprises a single layer 610 disposed on a base 620. This layer 610 may be any suitable material, including an oxide, single-crystalline silicon or other semiconductor, polycrystalline silicon or metals, amorphous silicon, high-k dielectric, low-k dielectric, other dielectric materials, nitrides, such as SiN, TiN, and others, carbon, including diamond-like, graphitic, spin-on, amorphous, and others, other carbon-based layers, resist, metal-containing resist, spin-on glass, SiOC, SiCN, and SiON.

In some embodiments, argon may be used as the etching species, either alone or with nitrogen. These directional etching processes may be performed using a large tilt angle, such as greater than 50°. In some embodiments, the tilt angle may be up to 80°. In certain embodiments, the tilt angle may be up to 60°. In these embodiments, the change in CD may be less than 2 nanometers, while a reduction in LER and LWR of at least 15% was achieved. In certain embodiments, the reduction in LER and LWR is at least 20%. In certain embodiments, the reduction in LER and LWR is at least 25%. These reductions may be achieved while the CD is changed by less than 2 nm.

While the use of argon may cause sputtering of the feature 600, which reduces its LER and LWR, other reactions may also be used. For example, reactive chemistries may be used to chemically remove material from the features. For example, in another embodiment, a mixture of $CHF_3$ and nitrogen was used as the etching species. In these embodiments, the change in CD may be less than 2 nanometers, while the reduction in LER and LWR of at least 15% was achieved. In certain embodiments, the reduction in LER and LWR is at least 20%. In certain embodiments, the reduction in LER and LWR is at least 25%. These reductions may be achieved while the CD is changed by less than 2 nm.

In other words, the present method is applicable to features having various compositions, including those enumerated above. The use of tilt angles, which may be between 30° and 80°, and in certain embodiments, between 50° and 65°, enables a directional etching process that reduces LER and LWR by more than 15%, while reducing the CD of the feature by less than 2 nanometers.

Figure 7:
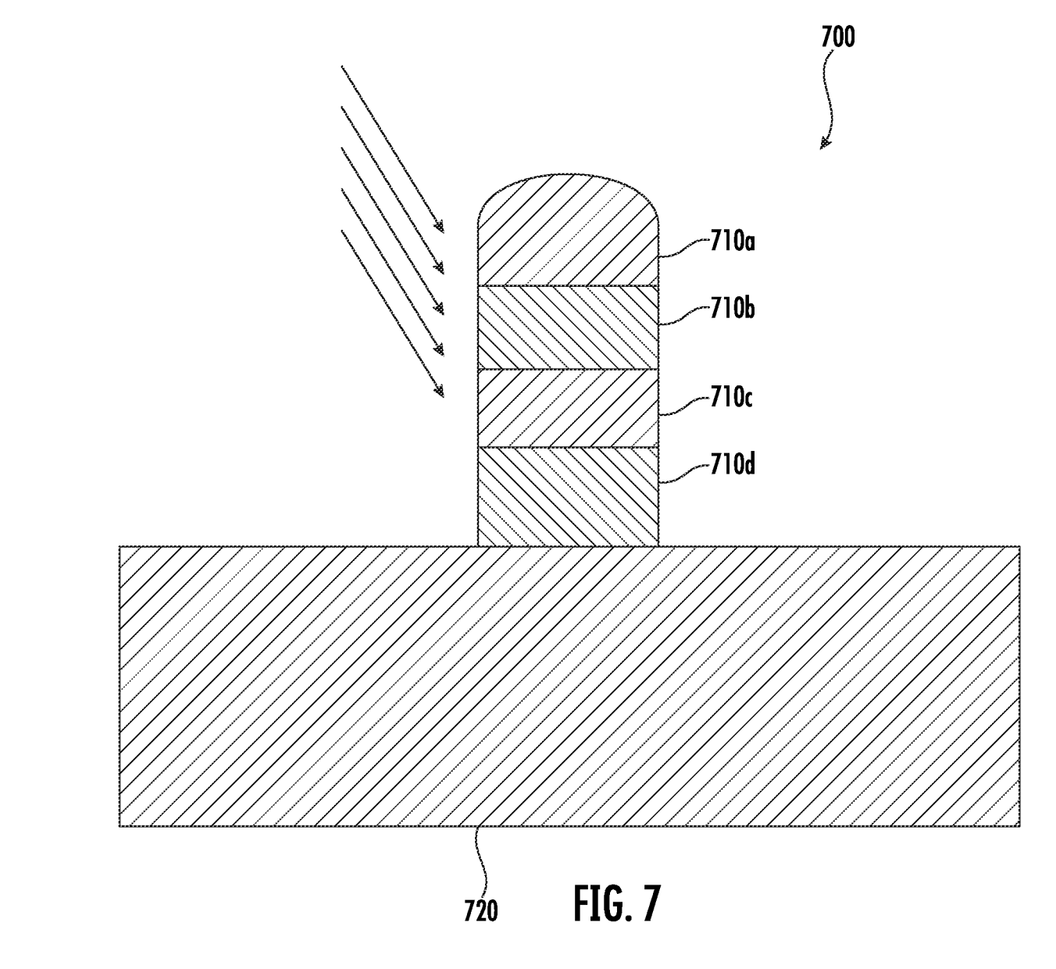
FIG. 7 shows a feature disposed on a semiconductor workpiece according to a third embodiment.

FIG. 7 shows a feature 700 according to a third embodiment, having a plurality of layers 710a, 710b, 710c, 710d. These layers may be any of the materials described above with respect to FIG. 6. While four different layers are shown, the disclosure is not limited to this embodiment. For example, there may be as few as two layers. The maximum number of layers is not limited by this disclosure. The thickness of each layer may be between 10 nm and hundreds of microns. The feature 700 may be disposed on a base 720.

Because the feature 700 comprises a plurality of layers, in certain embodiments, multiple directional etching processes may be employed. For example, in the feature shown in FIG. 7, it may be advantageous to conduct a first directional etching process to target smoothing of one or more of layers 710a-710d and a second directional etching process to target others of the layers. Thus, in certain embodiments, the etching species may selectively etch one layer of the feature more than a second layer of the feature.

For example, in one embodiment, a first directional etching process may be performed using $CHF_3$ as the etching species. After completion, a second directional etching process may be performed using a mixture of argon and nitrogen as the etching species. Using this combination, the LER and LWR were reduced by more than 15%, while the CD was reduced by less than 2 nm.

In another embodiment, the first directional etching process was performed using argon as the etching species. After completion, a second directional etching process was performed using a mixture of argon and nitrogen as the etching species.

In each of the embodiments described with respect to FIG. 7, a high tilt angle, such as between 30° and 80°, was used. In certain embodiments, the tilt angle is between 50° and 65°.

While argon, a mixture of argon and nitrogen and $CHF_3$ are described as etching species, the disclosure is not limited to these species. For example, other inert gasses may be used as the sputtering species. Additionally, inert gasses, fluorocarbons, hydrofluorocarbons, hydrocarbons, ammonia, oxygen, chlorine, $SF_6$, halogen-based compounds, including NF3 and HBr, and mixtures of these gasses may be used as the chemically reactive species.

Figure 8:
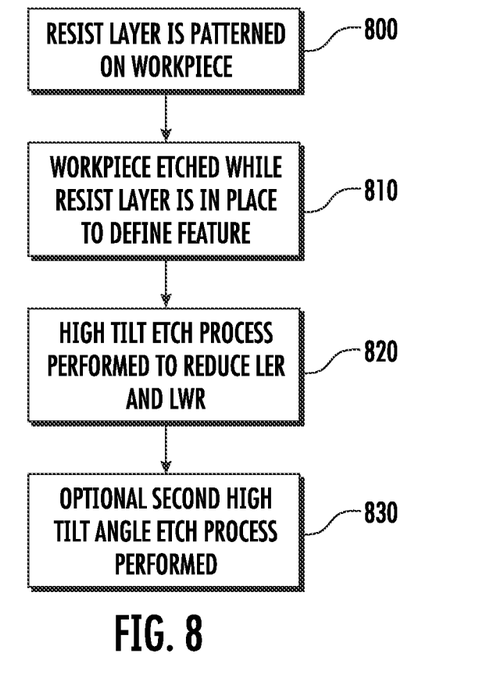
FIG. 8 shows a sequence to process features on a workpiece.

FIG. 8 shows a sequence of processes that may be performed to reduce the LER and LWR of a feature while minimally impacting the CD of the feature. First, as shown in Box 800, a resist layer may be patterned on a workpiece. Next, as shown in Box 810, the workpiece is etched while the resist layer is in place so as to define a feature. This feature may have a critical dimension, a LER and LWR after etching. Next, as shown in Box 820, a high tilt angle etch process using a first species may be performed to reduce the LER and LWR while minimally affecting the CD of the feature. The first species may perform chemical etching or sputtering. In certain embodiments, such as those wherein the feature comprises a plurality of layers comprising different materials, a second high tilt angle etch process using a second species may be performed, as shown in Box 830. The second species may perform chemical etching or sputtering. In this embodiment, at least one of the first species or second species may be selected such that the species selectively etches certain layers more than other layers. In certain embodiments, the second high tilt angle etch process may be performed at a different tilt angle than the first high tilt angle process. For example, referring the FIG. 4A, the first high tilt angle etch process may be performed at a very high tilt angle so as to smooth the cap 400. The second high tilt angle etch process may be performed at a smaller tilt angle so as to reach down to the layer 410. In this embodiment, the first species and the second species may be the same or may be different. Thus, the first high tilt angle etch process and the second high tilt angle etch process may be performed using the same tilt angle, or different tilt angle and maybe performed using the same species or using different species.

The method described herein have many advantages. First, the present method utilizes only etching and therefore may be less time consuming than other prior art techniques to improve LER and LWR. Furthermore, as shown above, using high tilt angles, such as between 30° and 80°, it is possible to reduce LER and LWR by more than 15% while having minimal impact on the CD of the feature. Further, this directional etching process may be included anywhere in the fabrication process. Furthermore, by introducing a small twist angle, the LER and LWR may be further decreased with minimal impact on the CD of the feature.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of processing a feature on a workpiece, comprising:
    patterning a resist layer disposed on the workpiece;
    etching the workpiece while the resist layer is in place to define the feature on the workpiece, wherein the feature comprises a critical dimension, a line width roughness, and line edge roughness; and
    performing an etch process using a twist angle up to 10° and a high tilt angle, wherein ions are directed toward the feature and the high tilt angle is between 30° and 80°, and wherein after the etch process, the critical dimension of the feature is changed by less than 2 nanometers and the line width roughness and the line edge roughness of the feature are each reduced by at least 15%.

2. The method of claim 1, wherein the high tilt angle is between 50° and 65°.

3. The method of claim 1, wherein the etch process utilizes a sputtering species.

4. The method of claim 1, wherein the etch process utilizes a chemically reactive species.

5. The method of claim 1, wherein the line width roughness and the line edge roughness are each reduced by at least 20%.

6. The method of claim 1, wherein a non-zero twist angle is used during the etch process.

7. A method of processing a feature on a workpiece, wherein the feature comprises at least two layers of different materials, comprising:
    patterning a resist layer disposed on the workpiece;
    etching the workpiece while the resist layer is in place to define the feature on the workpiece, wherein the feature comprises a critical dimension, a line width roughness, and line edge roughness;
    performing a first etch process using a first species, a first twist angle and a first high tilt angle, wherein ions of the first species directed toward the feature, the first twist angle is up to 10° and the first high tilt angle between 30° and 80°; and
    performing a second etch process using a second species, a second twist angle and a second high tilt angle, wherein ions of the second species are directed toward the feature, the second twist angle is up to 10° and the second high tilt angle is between 30° and 80°, and wherein after the first etch process and second etch process, the critical dimension of the feature is chanced by less than 2 nanometers and the line width roughness and the line edge roughness of the feature are each reduced by at least 15%.

8. The method of claim 7, wherein one of the first species and the second species is selected to selectively etch one of the at least two layers of the feature.

9. The method of claim 7, wherein the first high tilt angle is different from the second high tilt angle.

10. The method of claim 7, wherein at least one of the first species or the second species comprises a sputtering species.

11. The method of claim 7, wherein at least one of the first species or the second species comprises a chemically reactive species.

12. The method of claim 7, wherein the first high tilt angle is between 50° and 65°.

13. The method of claim 7, wherein the second high tilt angle is between 50° and 65°.

14. The method of claim 7, wherein the line width roughness and the line edge roughness are each reduced by at least 20%.

15. The method of claim 7, wherein a non-zero twist angle is used during at least one of the first etch process and the second etch process.

* * * * *